(12) United States Patent
Chiba et al.

(10) Patent No.: US 10,822,714 B2
(45) Date of Patent: *Nov. 3, 2020

(54) METHOD OF GROWING CRYSTAL IN RECESS AND PROCESSING APPARATUS USED THEREFOR

(71) Applicant: TOKYO ELECTRON LIMITED, Tokyo (JP)

(72) Inventors: Yoichiro Chiba, Nirasaki (JP); Daisuke Suzuki, Nirasaki (JP); Kazuhide Hasebe, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 7 days.

This patent is subject to a terminal disclaimer.

(21) Appl. No.: 15/450,461

(22) Filed: Mar. 6, 2017

(65) Prior Publication Data

US 2017/0253989 A1    Sep. 7, 2017

(30) Foreign Application Priority Data

Mar. 7, 2016 (JP) .................................. 2016-043022

(51) Int. Cl.
    *C30B 1/02* (2006.01)
    *C23C 16/04* (2006.01)
    (Continued)

(52) U.S. Cl.
    CPC ............ *C30B 1/026* (2013.01); *C23C 16/045* (2013.01); *C23C 16/06* (2013.01); *C23C 16/24* (2013.01);
    (Continued)

(58) Field of Classification Search
    CPC ....... C23C 16/06; C23C 16/458; C23C 16/52; C30B 1/026; C30B 29/06; C30B 29/08; C30B 29/52; C30B 29/68
    See application file for complete search history.

(56) References Cited

U.S. PATENT DOCUMENTS

2009/0124077 A1* 5/2009 Okada ..................... C23C 16/24
                                                            438/658
2011/0287629 A1* 11/2011 Kakimoto ............. C23C 16/045
                                                            438/652

(Continued)

FOREIGN PATENT DOCUMENTS

JP          10-56154 A     2/1998
JP       2008-198996 A     8/2008

(Continued)

*Primary Examiner* — Hua Qi
(74) *Attorney, Agent, or Firm* — Nath, Goldberg & Meyer; Jerald L. Meyer (57) ABSTRACT

A method of growing a crystal in a recess in a substrate on which an insulating film having the recess is formed, includes: forming a first film on the insulating film at a thickness as not to completely fill the recess; etching the first film by an etching gas to remain the first film only in a bottom portion of the recess; annealing the substrate such that the first film in the bottom portion is modified into a crystalline layer; forming a second film on the insulating film and a surface of the crystalline layer at a thickness as not to completely fill the recess; annealing the substrate such that the second film is crystallized from the bottom portion through a solid phase epitaxial growth to form an epitaxial crystal layer; and etching and removing the second film remaining on the substrate by an etching gas.

9 Claims, 3 Drawing Sheets

(51) Int. Cl.
*C23C 16/24* (2006.01)
*C23C 16/56* (2006.01)
*C23C 16/06* (2006.01)
*C23C 16/458* (2006.01)
*C23C 16/52* (2006.01)
*C30B 29/06* (2006.01)
*C30B 29/08* (2006.01)
*C30B 29/52* (2006.01)
*C30B 29/68* (2006.01)

(52) U.S. Cl.
CPC ............ *C23C 16/458* (2013.01); *C23C 16/52* (2013.01); *C23C 16/56* (2013.01); *C30B 29/06* (2013.01); *C30B 29/08* (2013.01); *C30B 29/52* (2013.01); *C30B 29/68* (2013.01)

(56) References Cited

U.S. PATENT DOCUMENTS

| | | | |
|---|---|---|---|
| 2013/0248995 A1* | 9/2013 | Nishiwaki | H01L 29/41766 257/334 |
| 2015/0056791 A1* | 2/2015 | Onodera | C23C 16/045 438/479 |
| 2017/0253989 A1 | 9/2017 | Chiba et al. | |

FOREIGN PATENT DOCUMENTS

| JP | 4635051 B2 | 2/2011 |
|---|---|---|
| JP | 2012-4542 A | 1/2012 |
| KR | 10-2015-0022675 A | 3/2015 |

\* cited by examiner

FIG. 3

METHOD OF GROWING CRYSTAL IN RECESS AND PROCESSING APPARATUS USED THEREFOR

CROSS-REFERENCE TO RELATED APPLICATION

This application claims the benefit of Japanese Patent Application No. 2016-043022, filed on Mar. 7, 2016, in the Japan Patent Office, the disclosure of which is incorporated herein in its entirety by reference.

TECHNICAL FIELD

The present disclosure relates to a method of growing crystal such as silicon in a recess in a substrate to be processed on which an insulating film having the recess formed therein is formed, and a processing apparatus used therefor.

BACKGROUND

In manufacturing a semiconductor device, a process of filling a recess such as a trench or hole (contact hole or through hole) with silicon is often performed. The silicon filled in the recess is used as, for example, an electrode.

For example, there is known a technique for filling silicon into a trench. In such a technique, a polycrystalline silicon film is formed in the trench at such a thin thickness so not to clog the trench. An amorphous silicon is formed on the polycrystalline silicon film and subsequently, is subjected to an annealing treatment. An amorphous silicon layer thus formed is moved to fill the trench.

In addition, an attempt has been made to undergo silicon deposited in a recess in a solid phase epitaxial growth by an annealing treatment.

However, the aforementioned technique does not disclose such a crystal growth in a recess. In addition, no crystal for an epitaxial growth exists in a recess formed in an insulating film, which makes it impossible to undergo a solid phase epitaxial growth as it is.

SUMMARY

Some embodiments of the present disclosure provide a method of growing crystal in a recess formed in an insulating film by allowing the crystal to selectively undergo a solid phase epitaxial growth, and a processing apparatus used therefor.

According to one embodiment of the present disclosure, there is provided a method of growing a crystal in a recess in a substrate to be processed on which an insulating film having the recess formed therein is formed, the method including: forming a first film on a surface of the insulating film at such a thickness as not to completely fill the recess; subsequently, etching the first film by an etching gas such that the first film remains only in a bottom portion of the recess; subsequently, annealing the substrate to be processed such that the first film remaining in the bottom portion of the recess is modified into a crystalline layer; subsequently, forming a second film on the surface of the insulating film and a surface of the crystalline layer at such a thickness as not to completely fill the recess; subsequently, annealing the substrate to be processed such that the second film is crystallized from the bottom portion of the recess through a solid phase epitaxial growth to form an epitaxial crystal layer; and subsequently, etching and removing the second film remaining on the substrate to be processed by an etching gas According to another embodiment of the present disclosure, there is provided a processing apparatus for growing a crystal in a recess in a substrate to be processed on which an insulating film having the recess formed therein is formed, including: a processing container configured to receive the substrate to be processed; a gas supply part configured to supply a gas into the processing container; a heating mechanism configured to heat the interior of the processing container; an exhaust mechanism configured to exhaust the interior of the processing container to reduce an internal pressure of the processing container; and a control part configured to control the gas supply part, the heating mechanism, and the exhaust mechanism. The control part controls: the exhaust mechanism to reduce the internal pressure of the processing container to a predetermined pressure; the heating mechanism to keep the interior of the processing container at a predetermined temperature; the gas supply part to supply a first gas into the processing container such that a first film is formed on a surface of the insulating film at such a thickness as not to completely fill the recess; subsequently, the gas supply part to supply an etching gas into the processing container so as to etch the first film such that the first film remains only in a bottom portion of the recess; subsequently, the gas supply part to supply an annealing gas into the processing container so as to anneal the substrate to be processed such that the first film remaining in the bottom portion of the recess is modified into a crystalline layer; subsequently, the gas supply part to supply a second gas into the processing container such that a second film is formed on the surface of the insulating film and a surface of the crystalline layer at such a thickness as not to completely fill the recess; subsequently, the gas supply part to supply an annealing gas into the processing container so as to anneal the substrate to be processed such that the second film is crystallized from the bottom portion of the recess through a solid phase epitaxial growth; and subsequently, the gas supply part to supply an etching gas into the processing container so as to etch and remove the second film.

According to yet another embodiment of the present disclosure, there is provided a non-transitory computer-readable storage medium storing a program that operates on a computer and controls a processing apparatus, wherein the program, when executed, causes the computer to control the processing apparatus so as to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, the embodiment of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Method of Growing Crystal in Recess>

Figure 1:
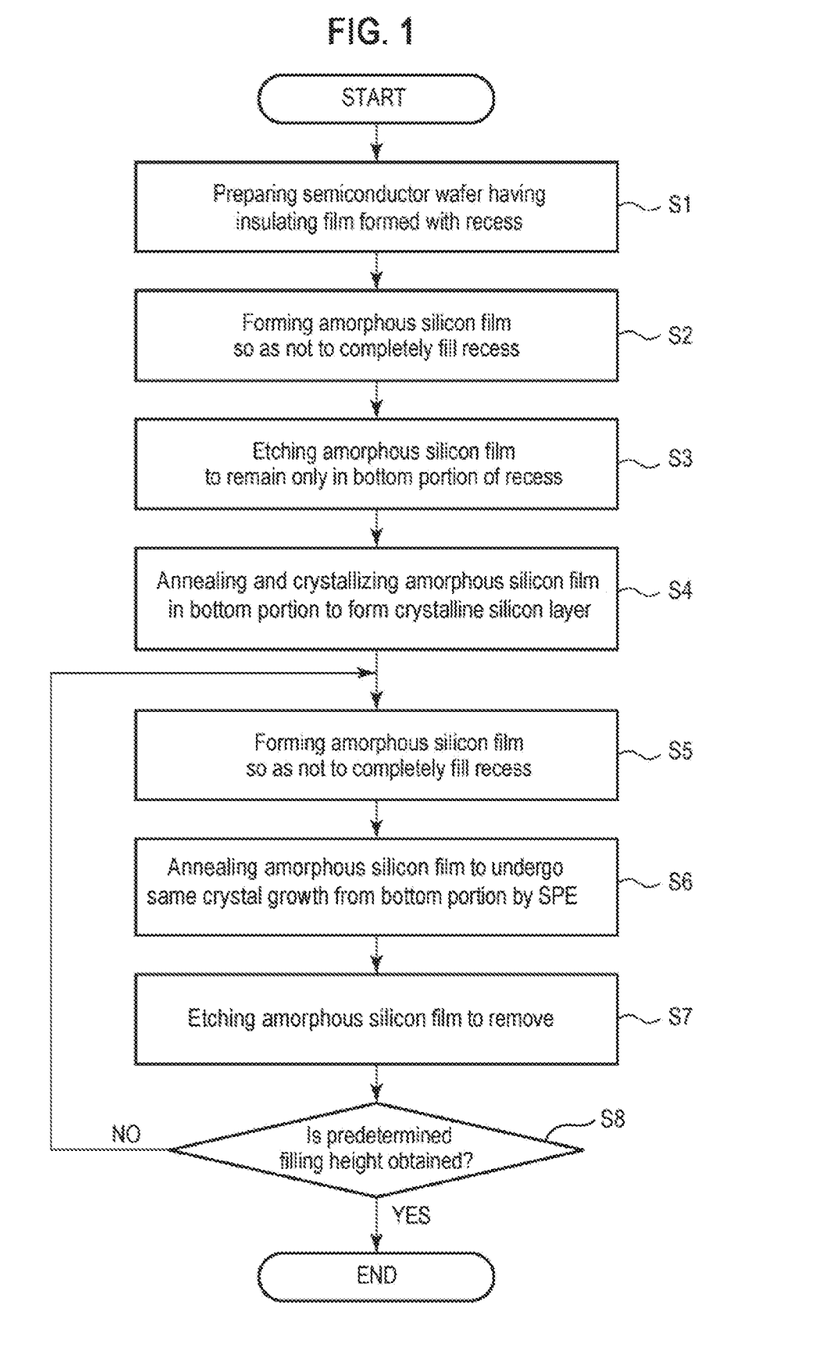
FIG. 1 is a flowchart illustrating a method of growing crystal in a recess, according to an embodiment of the present disclosure.

Now, an embodiment of a method of growing crystal in a recess, according to the present disclosure, will be described with reference to a flowchart of FIG. 1 and cross-sectional process views of FIGS. 2A to 2G.

Figure 2A:
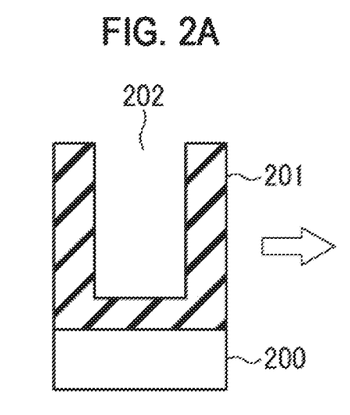
FIGS. 2A to 2G are cross-sectional process views for explaining the crystal growth method according to an embodiment of the present disclosure.

First, a semiconductor wafer (hereinafter, simply referred to as a wafer) is provided in which an insulating film 201 formed of an $SiO_2$ film, an SiN film or the like is on a base 200.

In the insulating film 201, there is formed a recess 202 such as a trench or hole in a predetermined pattern (Step S1, FIG. 2A). In addition, the base 200 may be a semiconductor substrate, or a base in which another layer is formed on the semiconductor substrate.

For example, the recess 202 may have an opening diameter or width of about 10 to 50 nm and a depth of about 50 to 300 nm.

Figure 2B:
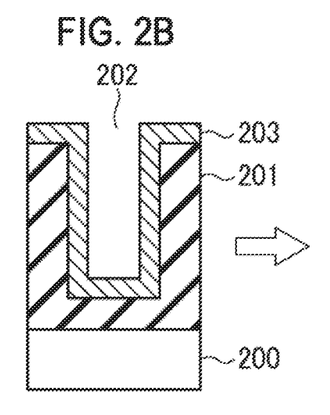

Subsequently, a silicon film as a first film, typically an amorphous silicon film 203 is formed (deposited) on a surface of the insulating film 201 at such a thickness as not to completely fill the recess 202 (Step S2, FIG. 2B). At this time, the amorphous silicon film 203 is formed by a CVD method using a silicon (Si)-raw material gas. A thickness of the amorphous silicon film 203 depends on a size and shape of the respective recess, and may be about 10 to 20 nm.

All Si-containing compounds applicable to the CVD method may be used as the Si raw material gas without being particularly limited. For example, silane-based compounds and amino-silane-based compounds may be used as the Si raw material gas. Examples of the silane-based compounds may include monosilane ($SiH_4$), disilane ($Si_2H_6$) or the like. Examples of the amino-silane-based compounds may include BAS (butyl-amino-silane), BTBAS (bistert-butyl-amino-silane), DMAS (dimethyl-amino-silane), BDMAS (bisdimethyl-amino-silane), or the like. Further, other silane-based gases or other amino-silane-based gases may be used.

In forming the amorphous silicon film 203, an impurity-containing gas may be used together with the Si raw material gas. Examples of the impurity may include arsenic (As), boron (B), or phosphorus (P). As the impurity-containing gas, arsine ($AsH_3$), diborane ($B_2H_6$), boron trichloride ($BCl_3$), or phosphine ($PH_3$) may be used.

Specific process conditions applied at this time may be as follows: a wafer temperature is 300 to 700 degrees C. and a pressure is about 0.1 to 10 Torr (13.3 to 1,333 Pa).

Figure 2C:
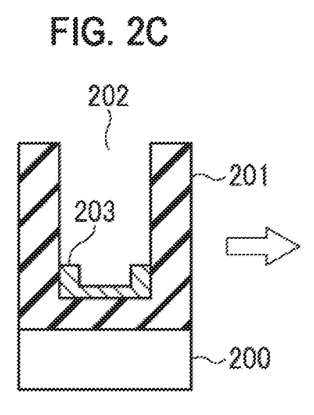

Subsequently, an etching gas is supplied onto the wafer to etch the amorphous silicon film 203 such that the amorphous silicon film 203 remains only in a bottom portion of the recess 202 (Step S3, FIG. 2C).

The etching gas is supplied from the top. As such, the amorphous silicon film 203 is etched from the surface thereof. Accordingly, as shown in FIG. 2C, an upper portion of the amorphous silicon film 203 and a lateral portion of the recess 202 are completely etched to expose the insulating film 201. In this way, the amorphous silicon film 203 may remain only in the bottom portion of the recess 202 to have a V-shape or U-shape.

As the etching gas used at this time, all gases may be used as long as they can etch the amorphous silicon. However, such gases are not particularly limited. For example, $Cl_2$, HCl, $F_2$, $Br_2$, HBr, or the like may be used as the etching gas. In some embodiments, other etching processes of removing silicon may be used in addition to an etching process using the etching gases, or instead of such an etching process, At this time, an etching temperature may be in the range of 200 to 500 degrees C. In this case, as the etching temperature increases within this range (400 degrees C. or more), there is a tendency for the amorphous silicon film to more easily remain in the bottom portion.

Subsequently, the wafer is subjected to annealing such that the amorphous silicon film 203 existing in the bottom portion of the recess 202 is crystallized. In this way, a crystalline silicon layer 204 is formed (Step S4 in FIG. 2D).

Figure 2D:
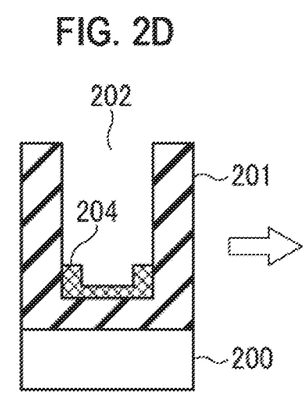

The annealing of the wafer in Step S4 may be performed at a temperature of 500 degrees C. or more, specifically 500 to 700 degrees C., and at a pressure of about $1.0 \times 10^{-10}$ to 1.0 Torr ($1.33 \times 10^{-8}$ to 133 Pa). In addition, the annealing may be performed in an atmosphere containing a hydrogen gas ($H_2$ gas), an atmosphere containing an inert gas such as a nitrogen ($N_2$) gas, or an atmosphere containing both the $H_2$ gas and the inert gas. By performing the annealing in the atmosphere containing the $H_2$ gas, it is possible to suppress the migration of silicon.

Figure 2E:
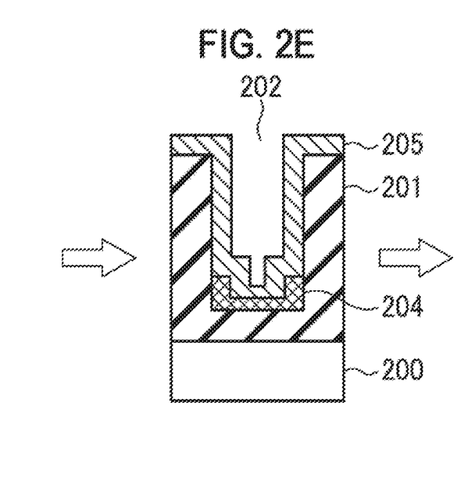

Subsequently, an amorphous silicon film 205 is formed (deposited) as a second film on surfaces of the insulating film 201 and the crystalline silicon layer 204 at such a thickness as not to completely fill the recess 202 (Step S5, FIG. 2E). Like Step S2, the amorphous silicon film 205 is formed by the CVD method using the silicon (Si)-raw material gas. As in Step S2, other Si-containing compounds applicable to the CVD method may be used as the Si raw material gas but not particularly limited thereto. For example, silane-based compounds and amino-silane-based compounds may be used.

In forming the amorphous silicon film 205, an impurity-containing gas may be used together with the Si raw material gas. An example of the impurity may include arsenic (As), boron (B), or phosphorus (P). As the impurity-containing gas, arsine ($AsH_3$), diborane ($B_2H_6$), boron trichloride ($BCl_3$), or phosphine ($PH_3$) may be used.

Figure 2F:
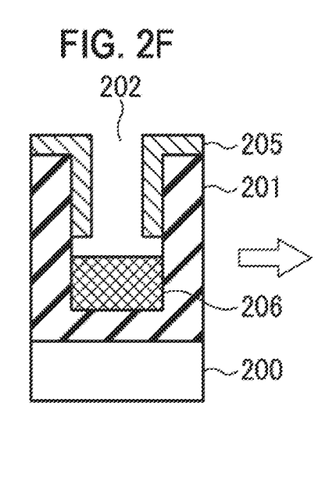

Thereafter, the wafer is annealed such that the amorphous silicon film 205 undergoes a crystal growth by a solid phase epitaxial (SPE) growth from a bottom portion (Step S6, FIG. 2F). Specifically, the amorphous silicon film 205 moves to the bottom portion by the annealing and undergoes the crystal growth by the solid phase epitaxial growth from the bottom portion such that the amorphous silicon film 205 succeeds to a crystal structure of the crystalline silicon layer 204. Thus, an epitaxial crystal layer 206 in which the crystalline silicon layer 204 and the amorphous silicon film 205 are unified is formed. At this time, the epitaxial crystal layer 206 and the remaining amorphous silicon film 205 are separated from each other due to a change in volume caused by the crystallization.

The annealing of the wafer in Step S6 may be performed at a wafer temperature of 300 to 600 degrees C. and at a pressure of about $1.0 \times 10^{-10}$ to 1.0 Torr ($1.33 \times 10^{-8}$ to 133 Pa). In addition, the annealing may be performed in atmosphere containing a hydrogen gas ($H_2$ gas) or atmosphere containing an inert gas such as a nitrogen gas. By performing the annealing in the atmosphere containing the $H_2$ gas, it is possible to suppress the migration of silicon.

Figure 2G:
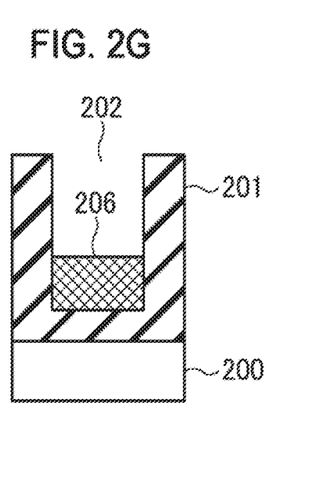

Subsequently, the amorphous silicon film 205 remaining on the lateral wall of the recess 202 and the upper portion of the insulating film 201 is removed by etching (Step S7, FIG. 2G).

At this time, the amorphous silicon film 205 is selectively etched using a difference in etching rate between the amorphous silicon film 205 and the epitaxial crystal layer 206.

Like the etching performed in Step S3, other gasses that can etch the amorphous silicon may be used as the etching gas without being particularly limited thereto. For example, $Cl_2$, HCl, $F_2$, $Br_2$, HBr, or the like may be used as the etching gas. Further, other etching processes of removing silicon may be used in addition to, or instead of the etching using such an etching gas.

Conditions used in the etching of Step S7 may be the same as that of Step S3. However, since the amorphous silicon film 205 is selectivity etched with respect to the epitaxial crystal layer 206, the amorphous silicon film 205 may be surely removed at a higher temperature range than that in Step S3. Further, even if the remaining silicon film is a polysilicon film, the polysilicon film can be selectively etched due to a difference in etching rate between the polysilicon film and the epitaxial crystal layer 206.

In this way, the recess 202 is filled with the epitaxial crystal layer 206. In a case where a height of the epitaxial crystal layer 206 thus filled is not sufficient, the forming process of the amorphous silicon film 205 in Step S5, the SPE process in Step S6, and the etching process in Step S7 are repeated several times until a sufficient filling height is obtained (Step S8).

As described above, in the present embodiment, the amorphous silicon film 203 is formed at such a thickness as not to completely fill the recess 202 on the semiconductor wafer on which the insulating film 201 having the recess 202 such as a trench or hole formed therein is formed. Subsequently, the amorphous silicon film 203 is etched using an etching gas such that the amorphous silicon film 203 remains in the bottom portion of the recess 202. Thereafter, the amorphous silicon film 203 remaining in the bottom portion is subjected to the annealing such that the amorphous silicon film 203 is modified to the crystalline silicon layer 204. Then, the amorphous silicon film 205 is formed on the crystalline silicon layer 204. The amorphous silicon film 205 is subjected to the annealing such that the amorphous silicon film 205 undergoes the solid phase epitaxial (SPE) growth. Thus, the epitaxial crystal layer 206 is formed.

Therefore, it is possible to selectively grow the silicon crystal layer from the bottom portion of the recess 202 through the solid phase epitaxial growth, even in the recess 202 formed in the insulating film 201.

Accordingly, it is possible to grow a good crystal without growing the crystal in the extra portion other than the recess and without the occurrence of defects such as voids in the recess.

Furthermore, a germanium (Ge) film or a silicon germanium (SiGe) film may be used instead of the amorphous silicon film 205 used in Step S5. The Ge film is formed by a CVD method using a Ge raw material gas and the SiGe film is formed by a CVD method using a Si raw material gas. All Ge-containing compounds applicable to the CVD method may be used as the Ge raw material gas without being particularly limited thereto. For example, germane-based compounds and amino-germane-based compounds may be used as the Ge raw material gas.

Examples of the germane-based compounds may include mono-germane ($GeH_4$), di-germane ($Ge_2H_6$), or the like. Examples of the amino-germane-based compounds may include tris-dimethyl-amino-germane ($GeH(NMe_2)_3$), dimethyl-amino-germane ($GeH_3(NMe_2)_2$), bis-dimethyl-amino-germane ($GeH_2(NMe_2)_2$), or the like. Furthermore, other germane-based gases and other amino-germane-based gases may be used.

In the case of using the Ge film or the SiGe film instead of the amorphous silicon film 205, the main component of the crystal that grows in the recess 202 may be Ge or SiGe.

<Example of Film Forming Apparatus>

Figure 3:
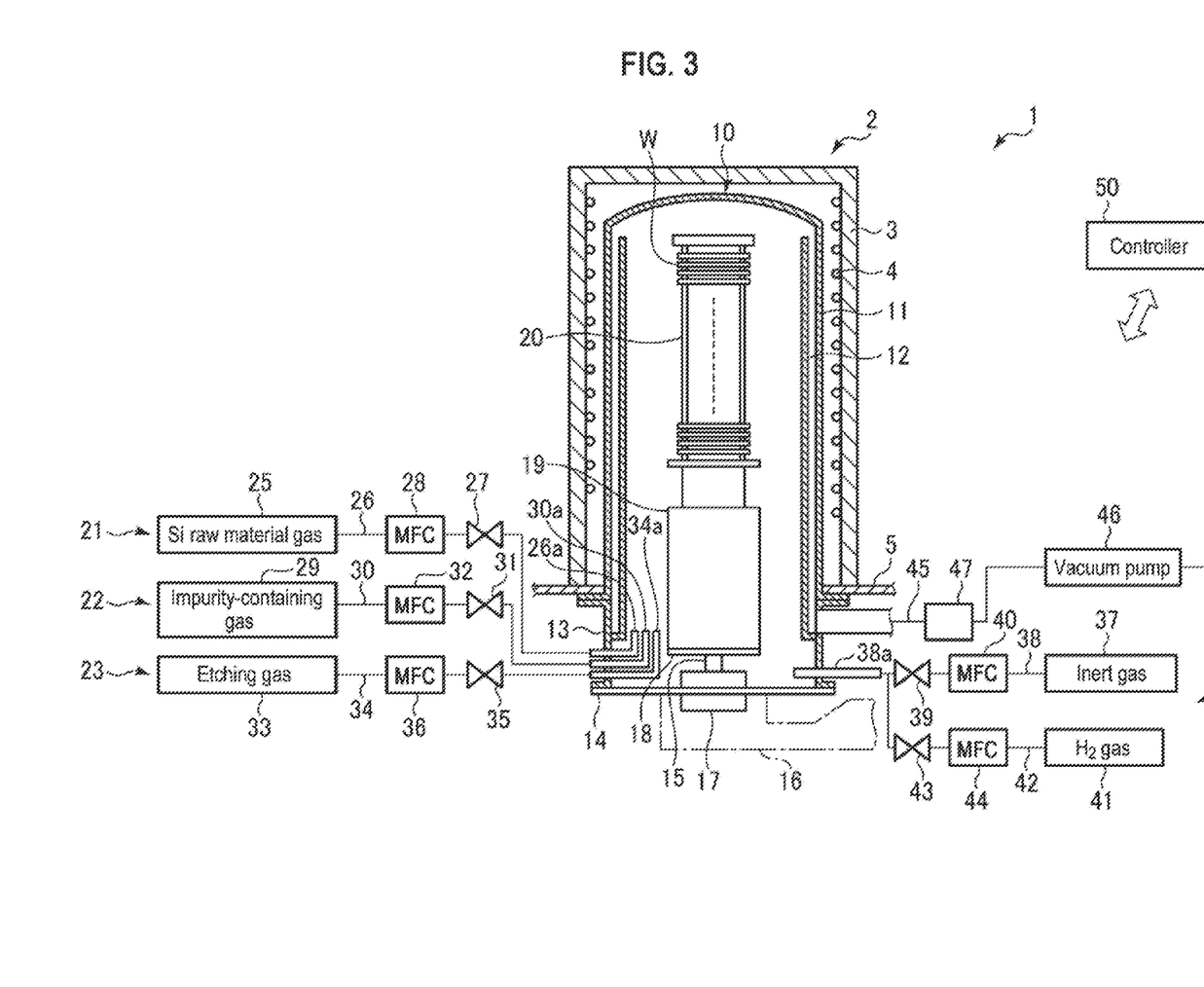
FIG. 3 is a longitudinal sectional view showing an example of a processing apparatus that can be used in implementing the crystal growth method of the present disclosure.

Next, an example of a processing apparatus that can be used in implementing the crystal growth method of the present disclosure will be described. FIG. 3 is a longitudinal sectional view showing a film forming apparatus as an example of the processing apparatus.

A film forming apparatus 1 includes a heating furnace 2 which is provided with a cylindrical insulating body 3 having a ceiling, and a heater 4 installed in an inner peripheral surface of the insulating body 3. The heating furnace 2 is installed on a base plate 5.

A processing container 10 is inserted into the heating furnace 2. The processing container 10 has a double tube structure, which is composed of an outer tube 11 with a top end thereof closed, and an inner tube 12 concentrically arranged inside the outer tube 11. Both the outer tube 11 and the inner tube 12 are made of, for example, quartz. In addition, the heater 4 is installed to surround the outer side of the processing container 10.

The outer tube 11 and the inner tube 12 are held at lower ends thereof by a cylindrical manifold 13 made of stainless steel or the like, respectively. A cap portion 14 is installed in a lower end opening portion of the manifold 13 to open and close the opening portion, thus hermetically sealing the opening portion.

A rotary shaft 15 passes through the center of the cap portion 14 to be rotatable in the hermetical state by, for example, a magnetic seal. A lower end of the rotary shaft 15 is connected to a rotating mechanism 17 of an elevation station 16 and an upper end thereof is fixed to a turntable 18. A quartz-made wafer boat 20 as a substrate holder configured to hold semiconductor wafers (hereinafter simply referred to as "wafers") which are substrates to be processed is mounted on the turntable 18 with a heat insulating tube 19 interposed between the wafer boat 20 and the turntable 18. The wafer boat 20 is configured to receive, for example, 50 to 150 sheets of wafers W which are stacked at predetermined pitches.

In addition, the elevation station 16 is moved up and down by a lifting mechanism (not shown) such that the wafer boat 20 can be loaded into or unloaded from the processing container 10. If the wafer boat 20 is loaded into the processing container 10, the cap portion 14 is brought into close contact with the manifold 13 so that a gap defined therebetween is air-tightly sealed.

Further, the film forming apparatus 1 includes: a Si raw material gas supply mechanism 21 configured to supply a Si raw material gas into the processing container 10, an impurity-containing gas supply mechanism 22 configured to supply an impurity-containing gas into the processing container 10; an etching gas supply mechanism 23 configured to supply an etching gas into the processing container 10; and a purge/annealing gas supply mechanism 24 configured to supply a purge gas or an annealing gas into the processing container 10. The combination of the Si raw material gas supply mechanism 21, the impurity-containing gas supply mechanism 22, the etching gas supply mechanism 23, and the purge/annealing gas supply mechanism 24 constitutes a gas supply part.

The Si raw material gas supply mechanism 21 includes an Si raw material gas supply source 25, an Si raw material gas pipe 26 through which a film forming gas is introduced from the Si raw material gas supply source 25, and an Si raw material gas nozzle 26a connected to the Si raw material gas pipe 26 and installed to pass through a lower portion of the lateral wall of the manifold 13. The Si raw material gas nozzle 26a is made of quartz. A valve 27 and a flow rate controller 28 such as a mass flow controller are installed in the Si raw material gas pipe 26 to control a flow rate of the Si raw material gas flowing through the valve 27 and the flow rate controller 28.

The impurity-containing gas supply mechanism 22 includes; an impurity gas supply source 29; an impurity-containing gas pipe 30 through which an impurity-containing gas is introduced from the impurity gas supply source 29; and an impurity-containing gas nozzle 30a connected to the impurity-containing gas pipe 30 and installed to pass through the lower portion of the lateral wall of the manifold 13. The impurity-containing gas nozzle 30a is made of quartz. A valve 31 and a flow rate controller 32 such as a mass flow controller are installed in the impurity-containing gas pipe 30 to control a flow rate of the impurity-containing flowing through the valve 31 and the flow rate controller 32.

The etching gas supply mechanism 23 includes an etching gas supply source 33, an etching gas pipe 34 through which an etching gas is introduced from the etching gas supply source 33, and an etching gas nozzle 34a connected to the etching gas pipe 34 and installed to pass through the lower portion of the lateral wall of the manifold 13. The etching gas nozzle 34a is made of quartz. A valve 35 and a flow rate controller 36 such as a mass flow controller are installed in the etching gas pipe 34 to control a flow rate of the etching gas flowing through the valve 35 and the flow rate controller 36.

The purge/annealing gas supply mechanism 24 includes: an inert gas supply source 37; an $H_2$ gas supply source 41; an inert gas pipe 38 through which an inert gas is introduced from the inert gas supply source 37; a gas nozzle 38a connected to the inert gas pipe 38 and installed to pass through the lower portion of the lateral wall of the manifold 13; and an $H_2$ gas pipe 42 through which an $H_2$ gas is introduced from the $H_2$ gas supply source 41 and joined with the inert gas pipe 38. Valves 39 and 43 and flow rate controllers 40 and 44 such as mass flow controllers are installed in the inert gas pipe 38 and the $H_2$ gas pipe 42, respectively.

As described above, the Si raw material gas supplied from the Si raw material gas supply mechanism 21 is not particularly restricted as long as it is a Si-containing compound applicable to the CVD method. For example, silane-based compounds and amino-silane-based compounds may be used as the Si raw material gas.

As described above, examples of impurity of the impurity-containing gas supplied from the impurity-containing gas supply mechanism 22 may include As, B, and P. $AsH_3$, $B_2H_6$, $BCl_3$, or $PH_3$ may be used as the impurity-containing gas.

As described above, the etching gas supplied from the etching gas supply mechanism 23 is not particularly restricted as long as it can remove silicon. Examples of the etching gas may include $Cl_2$, HCl, $F_2$, $Br_2$, HBr, or the like.

A nobble gas such as a $N_2$ gas or an Ar gas may be used as the inert gas supplied from the purge/annealing gas supply mechanism 24. The inert gas is used for purging. The inert gas or the $H_2$ gas is used for annealing.

An exhaust pipe 45 is connected to an upper portion of the lateral wall of the manifold 13 in order to exhaust process gases from a gap defined between the outer tube 11 and the inner tube 12. The exhaust pipe 45 is connected to a vacuum pump 46 for exhausting the interior of the processing container 10. Further, a pressure control mechanism 47 including a pressure control valve and the like is installed in the exhaust pipe 45. In addition, the interior of the processing container 10 is exhausted by the vacuum pump 46 and an internal pressure of the processing container 10 is adjusted to a predetermined pressure by the pressure control mechanism 47.

Further, the film forming apparatus 1 includes a control part 50. The control part 50 includes a computer (CPU) for controlling respective components of the film forming apparatus 1, for example, various valves, mass flow controllers as flow rate controllers, a heater power supply, a driving mechanism such as a lifting mechanism or the like, a user interface including a keyboard for allowing an operator to enter commands for the management of the film forming apparatus 1 and a display for visually displaying operating states of the film forming apparatus 1, and a storage part that stores parameters for various processes that are executed in the film forming apparatus 1 or programs (namely, process recipes) for executing processes in respective components of the film forming apparatus 1 according to process conditions. If necessary, according to instructions inputted from the user interface, a certain process recipe is retrieved from the storage part and is executed by the computer. With this configuration, the recess filling method as described above is performed by the film forming apparatus 1 under the control of the computer. The process recipe is stored in the storage medium. The storage medium may be a hard disk, DVD, a semiconductor memory, or the like.

Hereinafter, process operations when the crystal growth method described above is performed by the film forming apparatus 1 configured as above will be described. The following process operations are performed by the control part 50 based on the process recipes stored in the storage medium of the storage part.

First, for example, 50 to 150 sheets of semiconductor wafers W in each of which a recess such as a trench or hole is formed in an insulating film in a predetermined pattern as described above, are loaded on the wafer boat 20. The wafer boat 20 on which the wafers W are loaded is placed on the turntable 18 with the heat insulating tube 19 interposed between the wafer boat 20 and the turntable 18. Then, the elevation station 16 is moved up such that the wafer boat 20 is loaded into the processing container 10 through the opening portion formed below the processing container 10.

At this time, the heater 4 heats the inside of the processing container 10 in advance such that a temperature of the central portion (the central portion in the vertical direction) of the wafer boat 20 reaches a temperature suitable to form the amorphous silicon film, for example, a predetermined temperature ranging from 300 to 700 degrees C. In addition, the internal pressure of the processing container 10 is adjusted to fall within a range of 0.1 to 10 Torr (13.3 to 1,333 Pa). Subsequently, the valve 27 is opened to supply, for example, an $SiH_4$ gas as an Si raw material gas into the processing container 10 (the inner tube 12) through the Si raw material gas pipe 26 from the Si raw material gas supply source 25. Then, a process of forming the amorphous silicon film is carried out at a temperature ranging from 300 to 700 degrees C. and at a pressure of $1.0 \times 10^{-10}$ to 1.0 Torr (1.33×10⁻⁸ to 133 Pa) while rotating the wafer boat 20. A flow rate of the raw material gas at this time is controlled to be a predetermined flow rate in the range of 50 to 5000 sccm by the flow rate controller 28. At this time, in parallel with the supply of the Si raw material gas, a predetermined impurity-containing gas may be introduced from the impurity-containing gas supply source 29 at a predetermined flow rate. The formation of the amorphous silicon film is terminated by closing the valve 27 at the time when the amorphous silicon film is formed at such a predetermined thickness as not to completely fill the recess.

Subsequently, the interior of the processing container 10 is exhausted through the exhaust pipe 45 by the vacuum pump 46. The valve 39 is opened to supply an inert gas such as an $N_2$ gas into the processing container 10 from the inert gas supply source 37 such that the interior of the processing container 10 is purged. The interior of the processing container 10 is kept at a predetermined temperature in the range of 200 to 500 degrees C. by the heater 4. Thereafter, the valve 39 is closed and the valve 35 is opened to supply a predetermined etching gas (for example, a $Cl_2$ gas) into the processing container 10 from the etching gas supply source 33 through the etching gas pipe 34. Thus, the silicon film remains only in the bottom portion of the recess in a V-shape or a U-shape. After a predetermined period of time, the valve 35 is closed and the etching process is terminated.

Subsequently, the interior of the processing container 10 is exhausted and purged by the same operation as described above, and the interior of the processing container 10 is kept at a predetermined temperature of 500 degrees C. or higher, specifically in a range of 500 to 700 degrees C., by the heater 4. Then, the annealing process is performed with respect to the wafer W in a state in which the internal pressure of the processing container 10 is adjusted to $1.0\times10^{-10}$ to 1.0 Torr ($1.33\times10^{-8}$ to 133 Pa) by opening the valve 39, or opening the valve 43 with the valve 39 closed, or opening both the valves 39 and 43 to supply either or both the inert gas and the $H_2$ gas into the processing container 10. In this way, the amorphous silicon film remaining in the bottom portion of the recess is crystallized to be modified into the crystalline silicon layer.

Thereafter, the interior of the processing container 10 is exhausted and purged by the same operation as described above, and the interior of the processing container 10 is kept at a predetermined temperature ranging from 300 to 700 degrees C. by the heater 4. Subsequently, the internal pressure of the processing container 10 is adjusted to 0.1 to 10 Torr (13.3 to 1,333 Pa). The valve 27 is opened to supply the Si raw material gas (for example, the $SiH_4$ gas) into the processing container 10 from the Si raw material gas supply source 25 through the Si raw material gas pipe 26 so that an amorphous silicon film is formed on the crystalline silicon layer formed in the bottom portion of the recess at a temperature of 300 to 700 degrees C. and at a pressure of $1.0\times10^{-10}$ to 1.0 Torr ($1.33\times10^{-8}$ to 133 Pa). At this time, a flow rate of the Si raw material gas is controlled to a predetermined flow rate ranging from 50 to 5,000 sccm by the flow rate controller 28. At this time, in parallel with the supply of the Si raw material gas, a predetermined impurity-containing gas may be introduced at a predetermined flow rate from the impurity-containing gas supply source 29. The formation of the amorphous silicon film is terminated by closing the valve 27 at the time when the amorphous silicon film is formed at such a predetermined thickness as not to completely fill the recess.

Subsequently, the interior of the processing container 10 is exhausted and purged by the same operation as described above, and the interior of the processing container 10 is kept at a predetermined temperature ranging from 300 to 600 degrees C. by the heater 4. Then, the annealing process is performed with respect to the wafer W in a state in which the internal pressure of the processing container 10 is adjusted to $1.0\times10^{-10}$ to 1.0 Torr ($1.33\times10^{-8}$ to 133 Pa) by opening the valve 39, or opening the valve 43 with the valve 39 closed, or opening both the valves 39 and 43 to supply either or both the inert gas and the $H_2$ gas into the processing container 10. In this way, an epitaxial crystal layer grows from a lower portion of the amorphous silicon film formed on the crystalline silicon layer through the solid phase epitaxial (SPE) growth.

Subsequently, the interior of the processing container 10 is exhausted and purged by the same operation as described above, and the internal temperature and pressure of the processing container 10 are set to predetermined temperatures by the heater 4. Thereafter, the valve 35 is opened to supply a predetermined etching gas (for example, a $Cl_2$ gas) into the processing container 10 from the etching gas supply source 33 through the etching gas pipe 34. Thus, the amorphous silicon film that remains on the upper portion of the insulating film and on the lateral wall of the recess is selectively etched.

The control part 50 controls the respective parts to repeatedly perform the formation of the crystalline silicon layer followed by the formation of the amorphous silicon film, the formation of the epitaxial crystal layer by SPE, and the selective etching of the amorphous silicon film until the epitaxial crystal layer has a predetermined height.

After the completion of the aforementioned processes, the interior of the processing container 10 is purged with an inert gas while exhausting the processing container 10 through the exhaust pipe 45 using the vacuum pump 46. Then, the internal pressure of the processing container 10 is returned to atmospheric pressure and the elevation station 16 is moved down to unload the wafer boat 20 out of the processing container 10.

As described above, the film forming apparatus 1 can process a plurality of wafers at one time and can consecutively execute all the operations of the crystal growth process inside the processing container 10. Accordingly, the throughput of the process is extremely high. In addition, from the viewpoint of further increasing the throughput, a temperature difference in respective operations may be minimized.

In some embodiments, in the case of forming a germanium film or silicon germanium film, instead of the amorphous silicon film used as the second film, a germanium raw material supply mechanism may be additionally employed.

The actual conditions may be exemplified as follows:
The number of wafers: 150 sheets
Formation of first amorphous silicon film
   Temperature: 500 degrees C.
   Pressure: 2.0 Torr (267 Pa)
   Flow rate of $SiH_4$ gas: 1,000 sccm
First etching
   Temperature: 400 degrees C.
   Pressure: 0.3 Torr (40 Pa)
   Flow rate of $Cl_2$ gas: 1,000 sccm
First annealing (Formation of crystalline silicon layer)
   Temperature: 650 degrees C.
   Pressure: $8.8\times10^{-3}$ Torr (1.2 Pa)
   Flow rate of $N_2$ gas: 1,500 sccm
Formation of second amorphous silicon film
   Temperature: 400 degrees C.
   Pressure: 1.0 Torr (133 Pa)

Flow rate of $Si_2H_6$ gas: 200 sccm
Second annealing (SPE process)
  Temperature: 550 degrees C.
  Pressure: $8.8 \times 10^{-3}$ Torr (1.2 Pa)
  Flow rate of $N_2$ gas: 1,500 sccm
Second etching
  Temperature: 300 degrees C.
  Pressure: 0.5 Torr (67 Pa)
  Flow rate of $Cl_2$ gas: 1,000 sccm <Other Applications>

Although in the above, the embodiments of the present disclosure have been described, the present disclosure is not limited to the above embodiments but may be modified variously without departing from the scope thereof.

For example, although in the above embodiments, there has been described an example in which the method of the present disclosure is implemented using the vertical batch type apparatus, the present disclosure is not limited thereto. In some embodiments, the method of the present disclosure may be implemented using other various kinds of film forming apparatuses such as a horizontal batch type apparatus or a single-wafer type apparatus. In addition, although in the above embodiments, there has been described an example in which all the processes are performed by a single apparatus, some of the processes (for example, etching or annealing) may be performed by another apparatus.

In addition, the material for the crystal growth is not limited to silicon, germanium, or silicon germanium as long as the material can undergo SPE growth.

Furthermore, while there has been described a case where the semiconductor wafer is used as a substrate to be processed, the substrate to be processed is not limited to the semiconductor wafer. For example, the substrate to be processed may be other substrates such as a glass substrate for a flat panel display, a ceramic substrate, and the like.

According to the present disclosure, a first film is formed at such a thickness as not to completely fill a recess on a substrate to be processed on which an insulating film having the recess such as a trench or hole formed therein is formed. Subsequently, the first film is etched by an etching gas so that the first film remains only in a bottom portion of the recess. In such a state, the first film remaining in the bottom portion of the recess is subjected to annealing to be modified into a crystalline layer. A second film is formed on the crystalline layer. Then, the second film is subjected to the annealing such that the second film is crystallized from the bottom portion of the recess through a solid phase epitaxial growth, thus forming an epitaxial crystal layer. Therefore, it is possible to selectively grow a crystal layer from the bottom portion in the recess through the solid phase epitaxial growth, even in the recess formed in the insulating film.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of growing a crystal in a recess formed in an insulating film, wherein the insulating film is formed on a substrate to be processed and includes a side surface defining a side wall of the recess and a bottom surface defining a bottom wall of the recess, the method consisting essentially of the following processes in order of recitation:
   (a) forming a first amorphous film on the the side surface and the bottom surface of the insulating film at such a thickness as not to completely fill the recess;
   (b) subsequently, etching the first amorphous film by an etching gas such that the first amorphous film remains only in a bottom portion of the recess;
   (c) subsequently, annealing the substrate to be processed such that the first amorphous film remaining in the bottom portion of the recess is modified into a crystalline layer formed on the bottom surface of the insulating film;
   (d) subsequently, forming a second amorphous film on the side surface of the insulating film and a surface of the crystalline layer at such a thickness as not to completely fill the recess;
   (e) subsequently, annealing the substrate to be processed such that the second amorphous film is crystallized from the bottom portion of the recess through a solid phase epitaxial growth to form an epitaxial crystal layer on the bottom surface of the insulting film;
   (f) subsequently, etching and removing the second amorphous film remaining on the side surface of the insulating film by an etching gas such that the epitaxial crystal layer is formed in the recess; and
   (g) repeating a sequence of the processes (d), (e), and (f) a multiple number of times.

2. The method according to claim 1, wherein the first amorphous film is formed by a CVD method using a silicon raw material gas, the second amorphous film is formed by a CVD method using a germanium raw material gas or by a CVD method using the silicon raw material gas and the germanium raw material gas.

3. The method according to claim 2, wherein the silicon raw material gas is a silane-based gas or an amino-silane-based gas, and the germanium raw material gas is a germane-based gas or an amino-germane-based gas.

4. The method according to claim 1, wherein the etching gas in the process (b) is one selected from the group consisting of $Cl_2$, HCl, $F_2$, $Br_2$, and HBr.

5. The method according to claim 4, wherein the process (b) is performed in a state in which a temperature of the substrate to be processed falls within a range of 200 to 500 degrees C.

6. The method according to claim 1, wherein the process (a) is performed in a state in which a temperature of the substrate to be processed falls within a range of 300 to 700 degrees C.

7. The method according to claim 1, wherein the process (c) is performed in a state in which a temperature of the substrate to be processed is 500 degrees C. or more.

8. A non-transitory computer-readable storage medium storing a program that operates on a computer and controls a processing apparatus,
   wherein the program, when executed, causes the computer to control the processing apparatus so as to perform the method of claim 1.

9. The method according to claim 1, wherein the first amorphous film is an amorphous silicon film, and the second amorphous film is an amorphous germanium film or an amorphous silicon germanium film.

* * * * *

UNITED STATES PATENT AND TRADEMARK OFFICE
CERTIFICATE OF CORRECTION

PATENT NO. : 10,822,714 B2
APPLICATION NO. : 15/450461
DATED : November 3, 2020
INVENTOR(S) : Yoichiro Chiba, Daisuke Suzuki and Kazuhide Hasebe Page 1 of 1

It is certified that error appears in the above-identified patent and that said Letters Patent is hereby corrected as shown below:

In the Claims

Claim 1, Column 12, Line 5, delete the phrase "forming a first amorphous film on the the side surface" and replace with "forming a first amorphous film on the side surface".

Signed and Sealed this
Eighth Day of December, 2020

Andrei Iancu
*Director of the United States Patent and Trademark Office*